(12) United States Patent
Garcia et al.

(10) Patent No.: US 7,056,625 B2
(45) Date of Patent: Jun. 6, 2006

(54) FOCUS DETECTION STRUCTURE

(75) Inventors: Jose J. Garcia, Hillsboro, OR (US); Sven Eric Henrichs, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 10/453,180

(22) Filed: Jun. 2, 2003

(65) Prior Publication Data

US 2004/0241558 A1 Dec. 2, 2004

(51) Int. Cl.
*G03F 9/00* (2006.01)

(52) U.S. Cl. .............................. 430/5; 430/30; 257/48; 257/797

(58) Field of Classification Search .................... 430/5, 430/30; 257/48, 797
See application file for complete search history.

(56) References Cited

U.S. PATENT DOCUMENTS

| 5,300,786 A | 4/1994 | Brunner et al. |
| 6,011,611 A | 1/2000 | Nomura et al. |
| 6,077,756 A | 6/2000 | Lin et al. |
| 6,288,556 B1 | 9/2001 | Sato et al. |
| 6,437,858 B1 | 8/2002 | Kouno et al. |

OTHER PUBLICATIONS

Hiroshi Nomura; "Accurate Measurement of Spherical and Astigmatic Aberrations by a Phase Shift Grating Reticle"; Nov. 2001; Yokohama, Japan; Jpn. J. Appl. Phys. vol. 40 (2001) pp. 6316-6322, Part 1, No. 11.

*Primary Examiner*—Christopher G. Young
(74) *Attorney, Agent, or Firm*—Fish & Richardson P.C.

(57) ABSTRACT

A mask or reticle includes a focus test area having a pattern of opaque lines, naked lines, and phase shifting lines. A resulting pattern on a wafer exposed through the focus test area may have a first area of the pattern shifted with respect to a second area of the pattern if the lithography system is out of focus. In some implementations, an area of the pattern may contract or expand if the lithography system is out of focus. An out of focus condition may be determined using a registration tool, scanning electron microscope (SEM), or an interferometer tool (OCD). An out of focus condition may be improved using out of focus information.

23 Claims, 3 Drawing Sheets

FOCUS DETECTION STRUCTURE

BACKGROUND

Lithography is used to pattern semiconductor device structures on wafers. Optimizing the lithography process is increasingly important as feature sizes decrease. For example, in order to accurately replicate a mask or reticle pattern on a substrate, errors in focus should be minimized.

Methods for detecting focus problems in lithography systems include using focus test patterns on a focus test mask. The test patterns are imaged on a wafer and a displacement of one part of the test pattern with respect to another is measured, where the amount and direction of the displacement reflects the amount and direction of defocus (e.g., a positive focus error or negative focus error).

A different method uses a two-exposure process. A test pattern includes one or more line and space patterns and one or more trim patterns, where the wafer is exposed through the line and space pattern during the first exposure, and through the trim pattern during the second exposure.

DESCRIPTION OF DRAWINGS

Like reference symbols in the various drawings indicate like elements.

DETAILED DESCRIPTION

Systems and techniques are described for determining focus errors in a lithography system. The systems and techniques of the current disclosure may provide a better signal to noise ratio than prior single exposure systems, and may allow focus to be monitored during production, unlike available two-exposure systems.

The systems and techniques described herein use one or more focus test areas on an imaging plate such as a mask or reticle. The focus test areas may include patterns of opaque, naked, and phase shifting regions (e.g., lines) to produce a focus test image on a wafer or other surface. Since the focus test image may be created using a single exposure, the focus test areas may be integrated on process masks/reticles. Therefore, a separate focus monitoring step is not necessary.

Note that the term "opaque" refers to regions of the focus test area that generally do not transmit light of the frequency used to perform the lithography. However, opaque regions may transmit a small amount of light (i.e., the transmission probability is not necessarily zero). Similarly, the term "naked" generally refers to regions of the focus test area that transmit light rather than absorb or reflect light. However, some light may be reflected or absorbed in the naked regions.

Figure 1A:
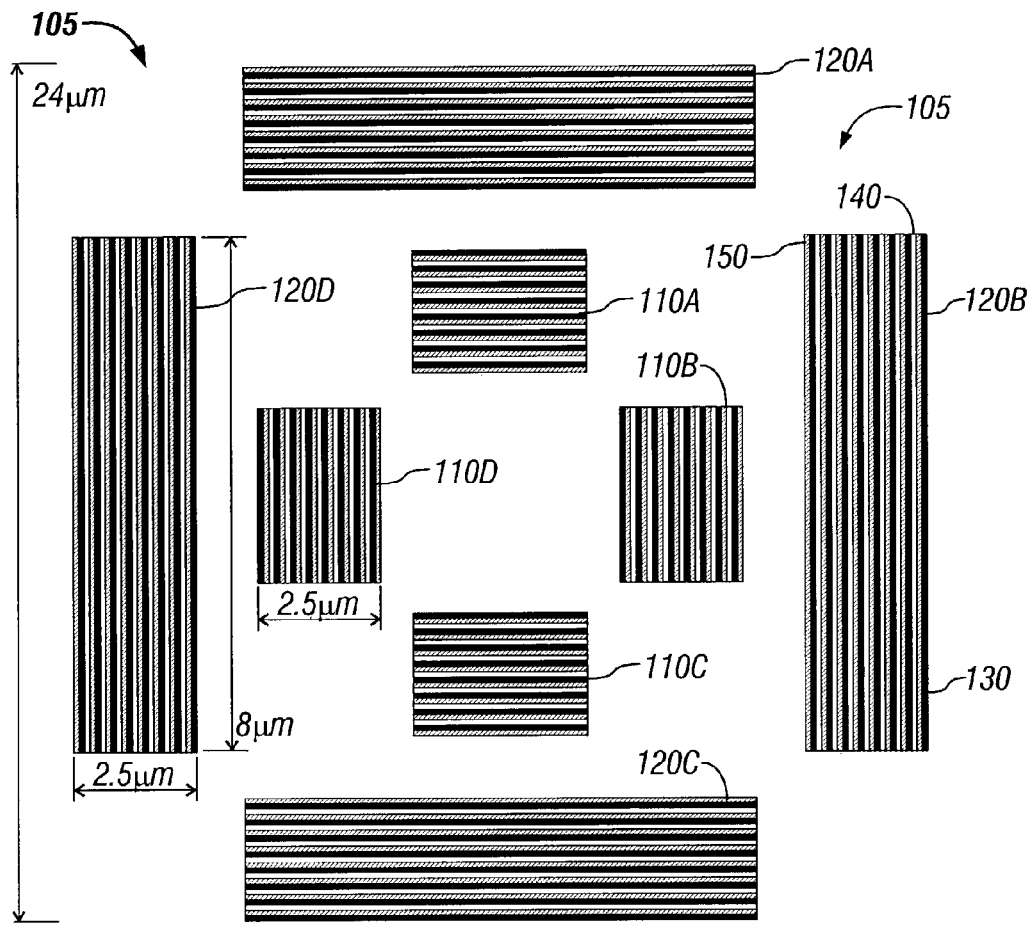
FIG. 1A shows an implementation of a focus test pattern.

FIG. 1A shows a portion of a mask that may be used to determine a focus condition of a lithography system. The mask includes a focus test area 105 with inner grating structures 110-A through 110-D, referred to generally as structures 110. Focus test area 105 also includes outer grating structures 120-A through 120-D, referred to generally as structures 120.

Each grating structure 110 and 120 includes a pattern of lines, including opaque lines 130, naked lines 140, and phase-shifting lines 150. The pitch of grating structures 110 and 120 (the center-to-center distance between adjacent opaque lines 130 in the pattern) may be smaller than the resolution of a registration tool that may be used to detect problems with focus. For example, the pitch may be less than 340 nm or between about 100 nm and about 340 nm.

Although it seems counter-intuitive to use gratings with a pitch that is smaller than the resolution of the detection system, one recognition of the present system is that doing so may provide a better signal to noise ratio, due to better edge detection. That is, although the registration tool may not be able to resolve individual lines in the test pattern, it may be better able to resolve the edges of the test pattern and thus to measure the de-focus.

In an implementation, the mask may comprise quartz. Opaque lines 130 may be formed using a chrome layer on the mask. Naked lines 140 may be regions of the mask that are not processed. Phase shifting lines 150 may be regions of the mask where a groove is formed in the mask, so that light travels a different distance through the mask in the regions comprising phase shifting lines 150 and is therefore out of phase with light traveling through the mask in regions comprising naked lines 140. Phase shifting lines 150 may be configured so that the phase difference is a value other than 0 degrees or 180 degrees, so that the position of outer structures 120 with respect to inner structures 110 shifts upon de-focus. For example, the phase difference may be 90 degrees.

The pattern of lines in structures 110 is opposite to that of structures 120. For example, structures 110-B and 110-D, the inner vertical structures, repeat a chrome/phase shift/naked pattern from left to right. In contrast, structures 120-B and 120-D, the outer vertical structures, repeat a phase shift/chrome/naked pattern from left to right. Similarly, structures 110-A and 110-C repeat a phase shift/chrome/naked pattern from top to bottom, while structures 120-A and 120-C repeat a chrome/phase shift/naked pattern from top to bottom.

Structures 110 and 120 of focus test area 105 may have the following dimensions. The width of structures 110 and 120 may be about 2.5 microns or less. The length of structures 120 may be about 8 microns, while the length of structures 110 may be about 4 microns. Focus test area 105 may be about 24 microns on each side. However, these dimensions are purely illustrative; other values may be used.

As a result, if the focal plane of the optical system is not correct (e.g., not locally coplanar with the top surface of the wafer to be patterned), the image of inner structures 110 will be shifted with respect to the image of outer structures 120.

Figure 1B:
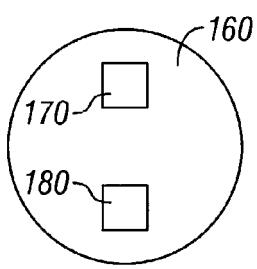
FIG. 1B shows an implementation of a wafer with a focus test pattern and a fabrication pattern.

Since a single exposure may be used, one or more focus test patterns such as pattern 105 of FIG. 1A may be incorporated on a production mask or reticle. As shown in FIG. 1B, a mask 160 may include one or more focus test patterns 170 (e.g., such as focus test pattern 105 of FIG. 1A). Mask 160 may also include one or more fabrication patterns 180, where fabrication patterns 180 include features to be patterned on a wafer in fabricating one or more integrated circuits or other devices.

Figure 2A:
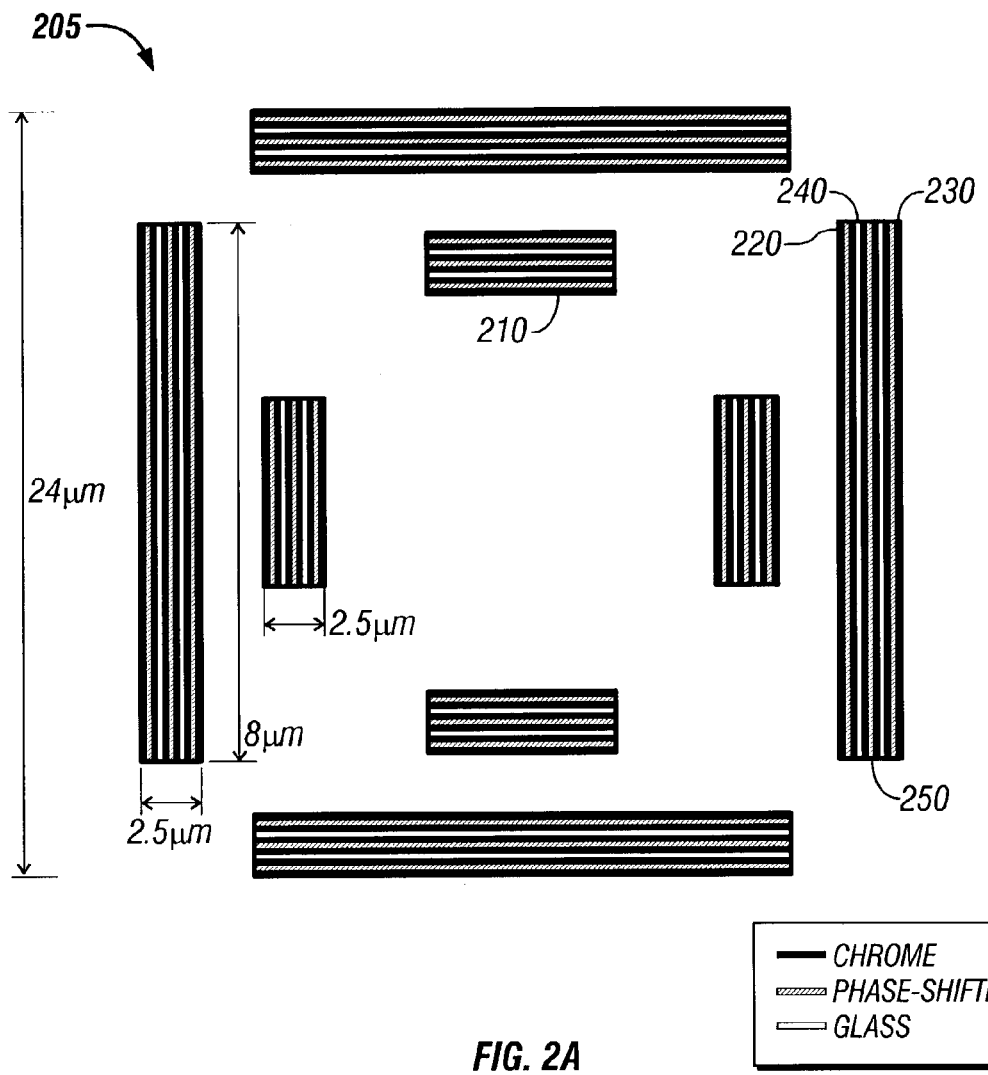
FIGS. 2A and 2B show different implementations of focus test patterns.

FIG. 2A shows a different implementation. A mask includes a focus test pattern 205. Focus test pattern 205 includes one or more inner structures 210 and one or more outer structures 220. Inner structures 210 and outer structures 220 include a pattern of opaque lines 230, naked lines 240, and phase-shifting lines 250.

As in the implementation of FIGS. 1A and 1B, opaque lines 230 may be chrome, naked lines 240 may be unprocessed regions of mask 200, and phase-shifting lines 250 may be regions of mask 200 where a groove is formed in the mask. However, in grating structures 210 and 220, a different pattern of lines is used. A recurring pattern of opaque/phase shifting/opaque/naked lines is used, with an even number of opaque lines. Further, the pattern may be the same for inner structures 210 and outer structures 220.

Using focus test pattern 205, the outer structures are not displaced with respect to the inner structures upon defocus. However, the transferred pattern of each of the structures in the test pattern would contract or expand across the grating as a result of an out of focus condition. For the pattern shown in FIG. 2A, each of the inner and outer structures 210 and 220 would shrink for a negative focus error and expand for positive focus error.

Figure 2B:
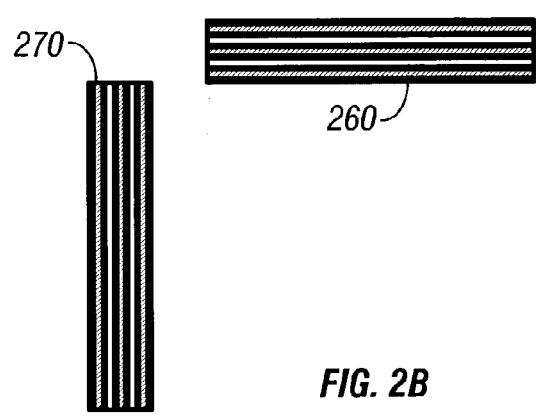

FIG. 2B shows an implementation using one horizontal structure 260 and one vertical structure 270, where structures 260 and 270 have the same pattern described with reference to FIG. 2A above. Since the focus measurement requires either measuring the distance between the edges of the structure or between a line and an adjacent line in the structure, a more elaborate test pattern need not be used.

Figure 3:
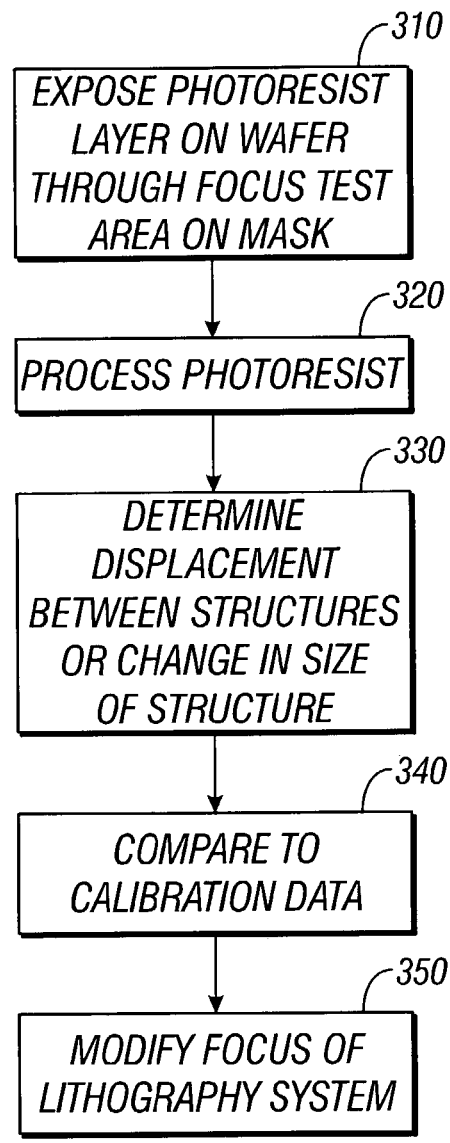
FIG. 3 illustrates a method of determining a focus condition.

FIG. 3 illustrates a method for determining the focus of a lithography system. A photoresist layer on a wafer is exposed through a focus test area on a mask at 310. The photoresist is processed (e.g., developed, etc.), leaving a remaining patterned photoresist layer on the wafer at 320.

A registration tool, scanning electron microscope (SEM), or an interferometer tool (OCD) may then be used to determine a displacement between structures (e.g., between the center of inner structures 110 and outer structures 120 of FIG. 1A), or to determine a change in size of the structure at 330. The displacement or change in size may be compared to calibration data to determine a focus condition of the lithography system at 340. The lithography system may be modified to improve the focus at 350. For example, one or more imaging parameters may be modified based on the focus condition.

Figure 4:
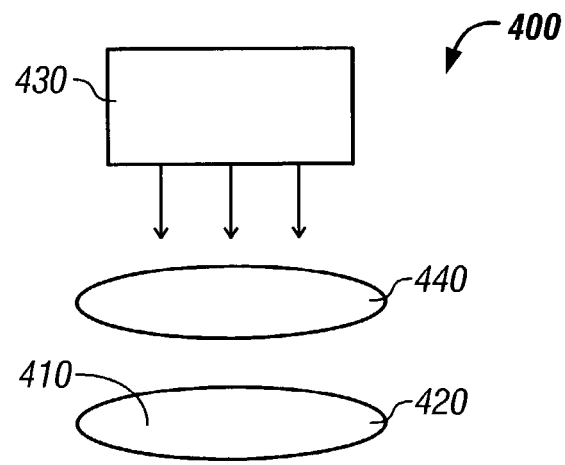
FIG. 4 shows an implementation of a lithography system.

FIG. 4 shows lithography system 400 using a mask or reticle including a focus test pattern such as that shown in FIG. 1A. A surface 410 of a wafer 420 is exposed to light from a light source 430 through a mask 440. Surface 410 may then be processed (e.g., the photoresist is developed, etc.) to produce a focus test pattern on wafer 420. Wafer 420 may subsequently be removed from system 400 to measure one or more aspects of the focus test pattern, or the one or more aspects of the focus test pattern may be measured in situ.

A number of implementations have been described. Nevertheless, it will be understood that various modifications may be made without departing from the spirit and scope of the invention. For example, different methods may be used to form opaque regions, naked regions, and phase shifting regions. Additionally, different test patterns may be used. Accordingly, other embodiments are within the scope of the following claims.

What is claimed is:

1. An apparatus, comprising;
an imaging plate including a focus test area patterned on the imaging plate, the focus test area including a grating structure with a repeating pattern of lines having a pitch of between 100 nm and 340 nm, the repeating pattern of lines including at least one naked line to transmit a first portion of incoming light, at least one phase shifting line to transmit a second portion of incoming light and to introduce a phase shift in the second portion with respect to the first portion, and at least one opaque line to block a third portion of incoming light.

2. The apparatus of claim 1, wherein the imaging plate comprises a mask.

3. The apparatus of claim 1, wherein the imaging plate comprises a reticle.

4. The apparatus of claim 1, wherein the grating structure is a horizontal grating structure and the repeating pattern of lines is a vertical repeating pattern of lines, and wherein when the vertical repeating pattern of lines is viewed from top to bottom with respect to a surface of the imaging plate, the order of the vertical repeating pattern of lines comprises an opaque line, a phase shifting line, another opaque line, and a naked line.

5. The apparatus of claim 1, wherein the grating structure is a vertical grating structure and wherein the repeating pattern of lines is a horizontal repeating pattern of lines, and wherein when the horizontal repeating pattern of lines is viewed from left to right with respect to a surface of the imaging plate, the order of the horizontal repeating pattern of lines is an opaque line, a phase shifting line, another opaque line, and a naked line.

6. The apparatus of claim 1, further including a light source to expose a wafer through the imaging plate.

7. The apparatus of claim 1, wherein the imaging plate further includes one or more fabrication patterns.

8. The apparatus of claim 1, wherein the at least one phase shifting line is to introduce a phase shift of other than 180 degrees.

9. The apparatus of claim 1, wherein the repeating pattern of lines comprises a first naked line adjacent to a first phase shifting line, which in turn is adjacent to a first opaque line, which in turn is adjacent to a second naked line, which in turn is adjacent to a second phase shifting line, which in turn is adjacent to a second opaque line.

10. The apparatus of claim 1, wherein the repeating pattern of lines comprises a first naked line adjacent to a first opaque line, which in turn is adjacent to a first phase shifting line, which in turn is adjacent to a second naked line, which in turn is adjacent to a second opaque line, which in turn is adjacent to a second phase shifting line.

11. The apparatus of claim 1, wherein the focus test area further comprises a second grating structure that is distinct from the grating structure yet includes the repeating pattern of lines, the second grating structure being oriented in a same direction as the grating structure and spaced within 24 micrometers of the grating structure.

12. The apparatus of claim 1, wherein the second grating structure is spaced within 19 micrometers of the grating structure.

13. An apparatus, comprising:
an imaging plate including a focus test area patterned on the imaging plate, the focus test area including:
a plurality of horizontal grating structures having a first ordered pattern having a pitch of between 100 nm and 340 nm, the first ordered pattern including at least one naked line to transmit a first portion of incoming light, at least one phase shifting line to transmit a second portion of incoming light and to introduce a phase shift in the second portion with respect to the first portion, and at least one opaque line to block a third portion of incoming light; and
a plurality of vertical grating structures each having a second ordered pattern of at least one naked line, at least one phase shifting line, and at least one opaque line and having a pitch of between 100 nm and 340 nm.

14. The apparatus of claim 13, wherein the plurality of horizontal grating structures includes a first horizontal grating structure having a first vertically ordered pattern of lines and a second horizontal grating structure having a second vertically ordered pattern of lines different than the first vertically ordered pattern of lines.

15. The apparatus of claim 13, wherein the plurality of vertical grating structures includes a first vertical grating structure having a first horizontally ordered pattern of lines and a second vertical grating structure having a second horizontally ordered pattern of lines different than the first horizontally ordered pattern of lines.

16. The apparatus of claim 13, wherein the plurality of vertical grating structures includes two inner vertical grating regions having a first horizontally ordered pattern of lines, two outer vertical grating structures having a second horizontally ordered pattern of lines different than the first horizontally ordered pattern of lines, two inner horizontal grating structures having a first vertically ordered pattern of lines, and two outer horizontal grating structures having a second vertically ordered pattern of lines different than the first vertically ordered pattern of lines.

17. The apparatus of claim 13, further including a light source to expose a wafer through the imaging plate.

18. The apparatus of claim 13, wherein the imaging plate further includes one or more fabrication patterns.

19. The apparatus of claim 13, wherein the at least one phase shifting line is to introduce a phase shift of other than 180 degrees.

20. The apparatus of claim 13, wherein the first ordered pattern comprises a first naked line adjacent to a first phase shifting line, which in turn is adjacent to a first opaque line, which in turn is adjacent to a second naked line, which in turn is adjacent to a second phase shifting line, which in turn is adjacent to a second opaque line.

21. The apparatus of claim 13, wherein the first ordered pattern comprises a first naked line adjacent to a first opaque line, which in turn is adjacent to a first phase shifting line, which in turn is adjacent to a second naked line, which in turn is adjacent to a second opaque line, which in turn is adjacent to a second phase shifting line.

22. The apparatus of claim 13, wherein the plurality of horizontal grating structures is spaced within 24 micrometers.

23. The apparatus of claim 13, wherein the plurality of horizontal grating structures is spaced within 19 micrometers.

* * * * *